(12) United States Patent
Staines et al.

(10) Patent No.: US 7,087,538 B2
(45) Date of Patent: Aug. 8, 2006

(54) METHOD TO FILL THE GAP BETWEEN COUPLED WAFERS

(75) Inventors: David Staines, Portland, OR (US); Grant M. Kloster, Lake Oswego, OR (US); Shriram Ramanathan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/919,550

(22) Filed: Aug. 16, 2004

(65) Prior Publication Data

US 2006/0035476 A1    Feb. 16, 2006

(51) Int. Cl.
*H01L 21/31* (2006.01)
*H01L 21/469* (2006.01)

(52) U.S. Cl. .................. 438/782; 438/792; 438/906

(58) Field of Classification Search ................ 438/782, 438/792, 906, 907, 949, 974
See application file for complete search history.

(56) References Cited

U.S. PATENT DOCUMENTS

| | | |
|---|---|---|
| 3,648,131 A | 3/1972 | Stuby |
| 3,705,332 A | 12/1972 | Parks |
| 4,607,779 A | 8/1986 | Burns |
| 4,689,113 A | 8/1987 | Balasubramanyam et al. |
| 4,897,708 A | 1/1990 | Clements |
| 4,954,875 A | 9/1990 | Clements |
| 4,998,665 A * | 3/1991 | Hayashi .................. 228/180.1 |
| 5,045,914 A | 9/1991 | Casto et al. |
| 5,229,647 A | 7/1993 | Gnadinger |
| 5,241,450 A | 8/1993 | Bernhardt et al. |
| 5,283,107 A | 2/1994 | Bayer et al. |
| 5,366,906 A | 11/1994 | Wojnarowski et al. |
| 5,401,672 A | 3/1995 | Kurtz et al. |
| 5,404,044 A | 4/1995 | Booth et al. |
| 5,419,806 A | 5/1995 | Huebner |
| 5,455,445 A | 10/1995 | Kurtz et al. |
| 5,473,197 A | 12/1995 | Idaka et al. |
| 5,510,655 A | 4/1996 | Tanielian |
| 5,545,281 A | 8/1996 | Matsui et al. |
| 5,608,265 A | 3/1997 | Kitano et al. |
| 5,627,106 A | 5/1997 | Hsu |
| 5,640,049 A | 6/1997 | Rostoker et al. |
| 5,656,554 A | 8/1997 | Desai et al. |
| 5,699,611 A | 12/1997 | Kurogi et al. |
| 5,717,247 A | 2/1998 | Koh et al. |
| 5,751,556 A | 5/1998 | Butler et al. |

(Continued)

FOREIGN PATENT DOCUMENTS

EP    0 293 459 B1    12/1987

(Continued)

OTHER PUBLICATIONS

Vendier et al., *Ultra Thin Electronics for Space Applications*, 2001 Electronic Components and Technology Conference, Copyright 2001, IEEE, 5 pages.

(Continued)

*Primary Examiner*—Phuc T. Dang
(74) *Attorney, Agent, or Firm*—Blakely, Sokoloff, Taylor & Zafman LLP

(57) ABSTRACT

A three-dimensional integrated circuit formed by applying a material to fill a gap between coupled wafers and slicing the coupled wafers into dice. A method for filling a gap between coupled wafers. Various embodiments include at least one of spinning a coupled wafer pair, drilling a hole into one of the coupled wafers, and using a vacuum to aid in the dispersion of the material.

63 Claims, 12 Drawing Sheets

U.S. PATENT DOCUMENTS

| | | | |
|---|---|---|---|
| 5,773,986 A | 6/1998 | Thompson et al. | |
| 5,825,080 A | 10/1998 | Imaoka et al. | |
| 5,880,010 A | 3/1999 | Davidson | |
| 5,886,535 A | 3/1999 | Budnaitis | |
| 5,901,050 A | 5/1999 | Imai | |
| 5,998,808 A | 12/1999 | Matsushita | |
| 6,100,181 A | 8/2000 | You et al. | |
| 6,165,864 A | 12/2000 | Shen et al. | |
| 6,238,951 B1 | 5/2001 | Caillat | |
| 6,255,726 B1 | 7/2001 | Vindasius et al. | |
| 6,297,072 B1 | 10/2001 | Tilmans et al. | |
| 6,340,608 B1 | 1/2002 | Chooi et al. | |
| 6,355,501 B1 | 3/2002 | Fung et al. | |
| 6,355,976 B1 | 3/2002 | Faris | |
| 6,373,130 B1 | 4/2002 | Salaville | |
| 6,391,669 B1 | 5/2002 | Fasano et al. | |
| 6,459,148 B1 | 10/2002 | Chun-Jen et al. | |
| 6,461,890 B1 | 10/2002 | Shibata | |
| 6,468,098 B1 | 10/2002 | Eldridge | |
| 6,495,924 B1 | 12/2002 | Kodama et al. | |
| 6,504,253 B1 | 1/2003 | Mastromatteo et al. | |
| 6,559,042 B1 | 5/2003 | Barth et al. | |
| 6,583,512 B1 | 6/2003 | Nakaoka et al. | |
| 6,593,645 B1 | 7/2003 | Shih et al. | |
| 6,594,025 B1 | 7/2003 | Forouhi et al. | |
| 6,608,371 B1 | 8/2003 | Kurashima et al. | |
| 6,643,920 B1 | 11/2003 | Hori | |
| 6,653,725 B1* | 11/2003 | Ahn et al. | 257/690 |
| 6,661,085 B1 | 12/2003 | Kellar et al. | |
| 6,724,084 B1 | 4/2004 | Hikita | |
| 6,762,076 B1 | 7/2004 | Kim et al. | |
| 6,882,045 B1 | 4/2005 | Massingill et al. | |
| 2001/0038148 A1 | 11/2001 | Mastromatteo et al. | |
| 2002/0017710 A1 | 2/2002 | Kurashima et al. | |
| 2002/0024628 A1 | 2/2002 | Walker et al. | |
| 2002/0163072 A1 | 11/2002 | Gupta et al. | |
| 2002/0195673 A1* | 12/2002 | Chou et al. | 257/414 |
| 2003/0079836 A1 | 5/2003 | Lin et al. | |
| 2003/0148596 A1 | 8/2003 | Kellar et al. | |
| 2003/0157782 A1 | 8/2003 | Kellar et al. | |
| 2004/0014308 A1 | 1/2004 | Kellar et al. | |
| 2004/0142540 A1 | 7/2004 | Kellar et al. | |

FOREIGN PATENT DOCUMENTS

WO      WO 88/04829      6/1988

OTHER PUBLICATIONS

Fan et al., *Cooper Wafer Bonding*, Electrochemical and Solid-State Letters, Copyright the Electrochemical Society, Inc., 1999, 3 pages.

McDonald et al., *Face to Face Wafer Bonding for 3D Chipstack Fabrication to Shorten Wire Lengths*, Jun. 27-29, 2000 VMIC Conference, pp. 90-94.

Ramm et al., InterChip Technology for Verical System Integration, Fraunhofer Institute for Reliability and Microintegration, Munich Germany, Infineon Technologies AG, Munich Germany, Copyright 2001 IEEE, pp. 160-162.

* cited by examiner

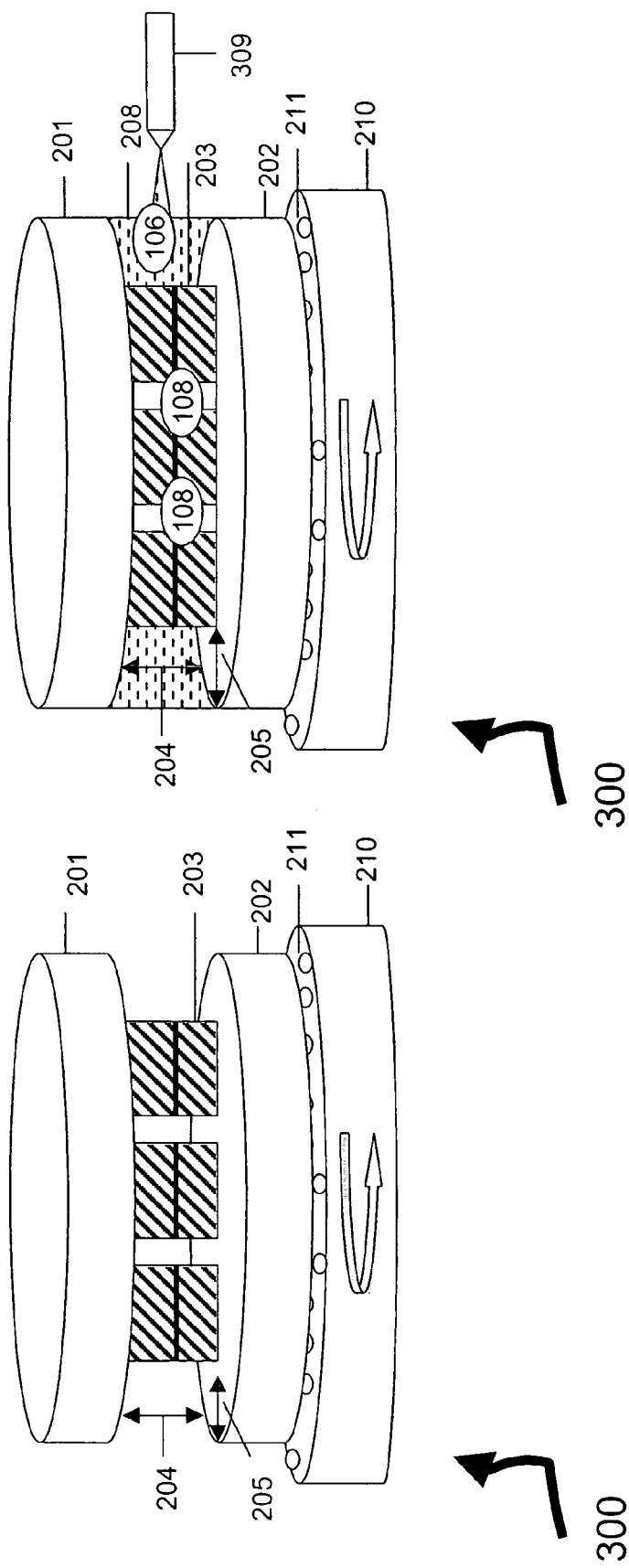

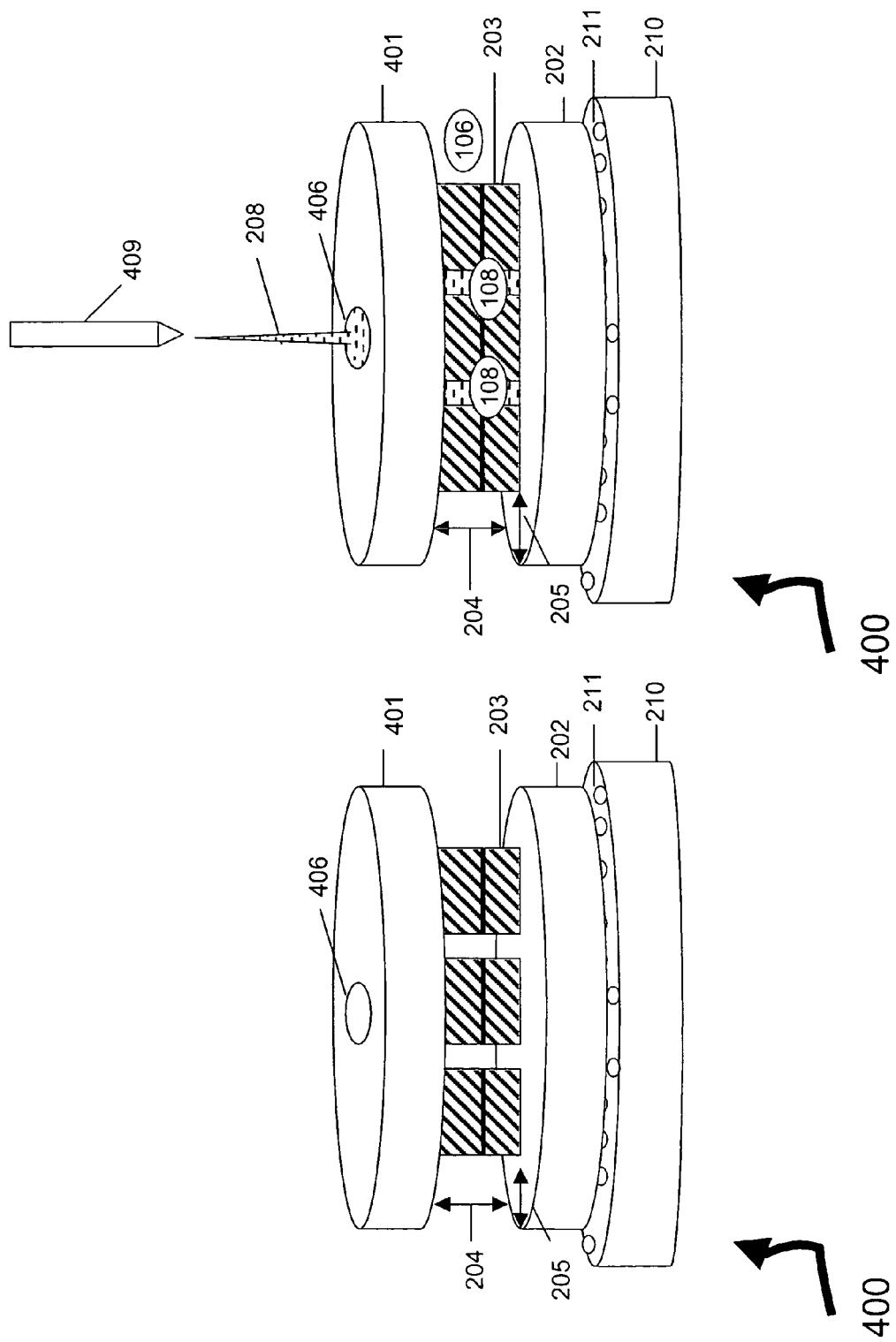

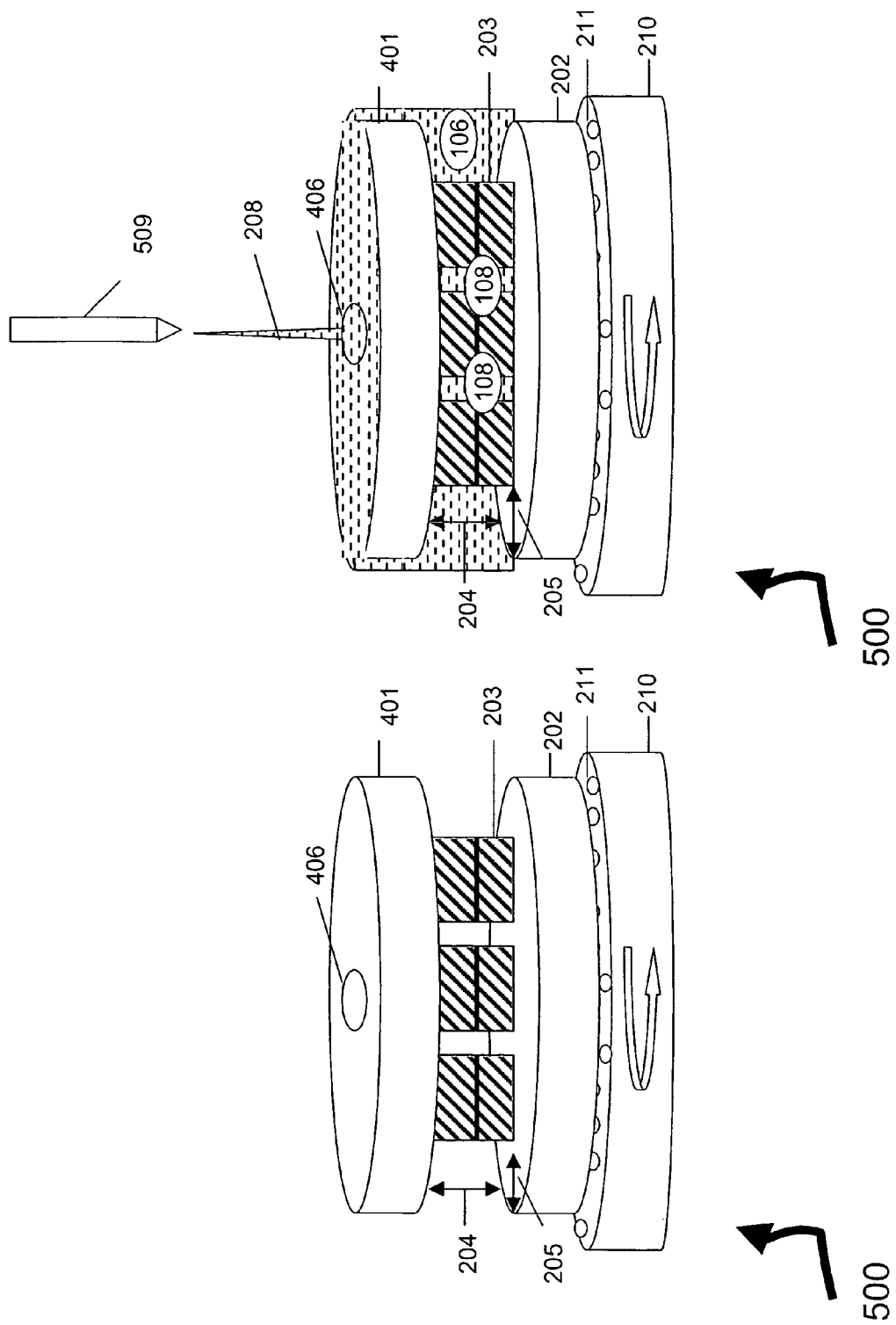

METHOD TO FILL THE GAP BETWEEN COUPLED WAFERS

BACKGROUND OF THE INVENTION

1. Field of the Invention

The present invention relates to the field of three dimensional integrated circuits and more specifically, to a method for forming a coupled wafer pair that prevents edge chipping.

2. Discussion of Related Art

In the manufacture of microelectronic devices, packaging density is becoming increasingly important. Stacking of the dice of a multi-processor microelectronic device is one way to improve the packaging density of a microelectronic device. Stacked microelectronic devices are typically formed by electrically connecting two or more wafers through interconnect layers, and then dicing the stacked wafers into individual stacked devices.

FIGS. 1A–1D illustrate one method for forming a coupled wafer pair. As shown in FIG. 1A, a first wafer 101 and a second wafer 102 are provided. Typically, these wafers are silicon polycrystalline wafers which have a plurality of die that are connected together. Typically, each die is an integrated circuit. Next, as shown in FIG. 1B, an interconnect layer 103 is formed on the first wafer 101 and on the second wafer 102. The interconnect layer 103 is typically copper that is formed above a barrier material such as tantalum and a dielectric layer such as silicon dioxide or carbon dioxide. Typically, there are hundreds of copper members in the interconnect layer 103.

Next, as shown in FIG. 1C, the first wafer 101 and its associated interconnect layer 103 is flipped around and positioned over the second wafer 102 and its interconnect layer 103. Next, in FIG. 1D, a coupled wafer pair 100 is formed by aligning the interconnect layers 103 of the first wafer 101 and the second wafer 102 and bringing the first wafer 101 and the second wafer 102 together. Typically a thermo-compression process is used to couple the first wafer 101 with the second wafer 102.

Typically, as shown in FIG. 1D, thinning 107 of one of the stacked wafers is performed by use of one or more mechanical and/or chemical processes such as a polishing process for example. These processes may cause mechanical stresses in unsupported portions of the wafer being thinned. As shown in an outer gap 106, an area formed by the product of a depth 105 and a height 104 is unsupported by the interconnect layer 103. Furthermore, a center gap 108 between individual members of the interconnect layer 103 may also be unsupported.

BRIEF DESCRIPTION OF THE DRAWINGS

FIGS. 3A–3B illustrates a method for applying a material directly in a gap between a coupled wafer pair in accordance with an embodiment of the present invention.

FIGS. 4A–4B illustrates a method for applying a material through a hole in a first wafer of a coupled wafer pair in accordance with an embodiment of the present invention.

FIGS. 5A–5B illustrates a method for applying a material through a hole in a first wafer of a coupled wafer pair and spinning the coupled wafer pair in accordance with an embodiment of the present invention.

DETAILED DESCRIPTION OF THE PRESENT INVENTION

Embodiments of the present invention are three dimensional integrated circuit devices having a gap fill and their methods of formation. In the following description numerous specific details have been set forth in order to provide a thorough understanding of the present invention. In other instances, well-known semiconductor fabrication processes and techniques have not been set forth in particular detail in order to avoid unnecessarily obscuring the present invention.

Embodiments of the present invention are a method for applying a material on a coupled wafer pair in order to fill a gap between wafers of the coupled wafer pair. Embodiments of the invention include applying a material through a hole within one of the wafers of the coupled wafer pair and creating a pressure differential to help the material flow between the coupled wafers. Embodiments of the invention include spinning a coupled wafer pair, applying a material on the top of or directly in a gap between the coupled wafer pair, and using a vacuum to create a pressure differential between the coupled wafers. The advantages of the present invention include protecting gaps between a coupled wafer pair from chipping, cracking, corroding, or other damage which may result in the wafer and/or individual stacked devices being unusable.

Figure 1B:
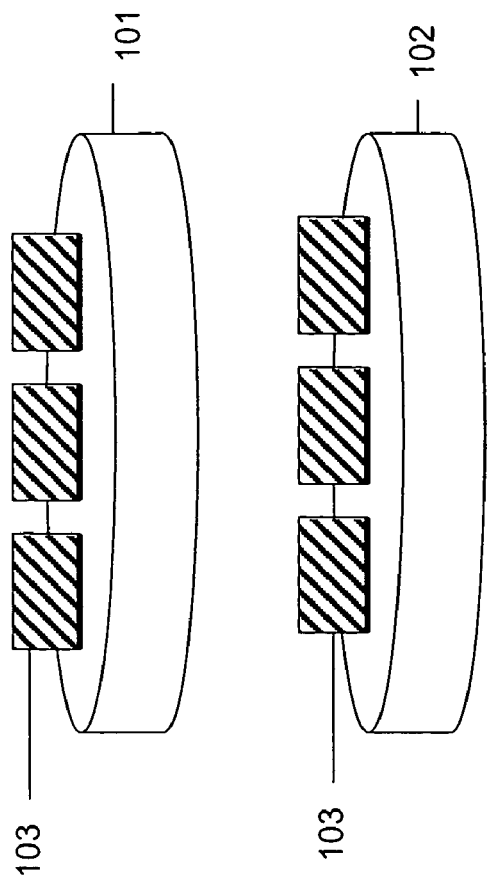
FIGS. 1A–1D illustrates a conventional method of forming a coupled wafer pair.
Figure 1A:
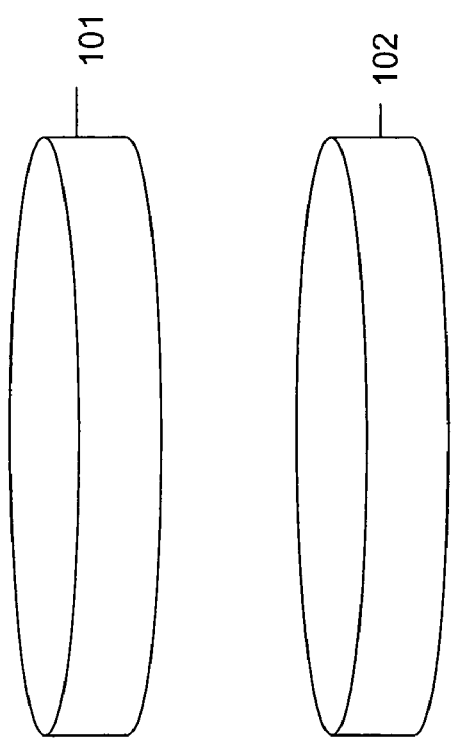
Figures 1C, 1D:
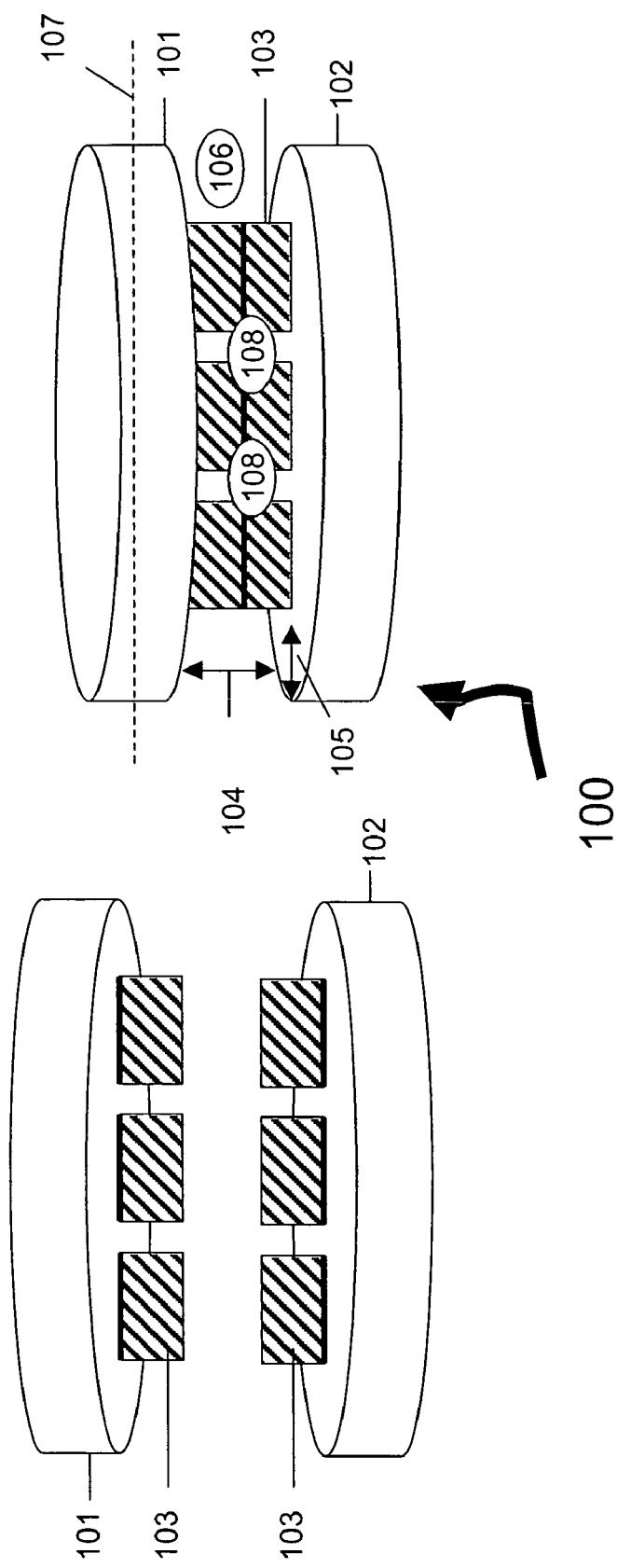
Figures 2A, 2B:
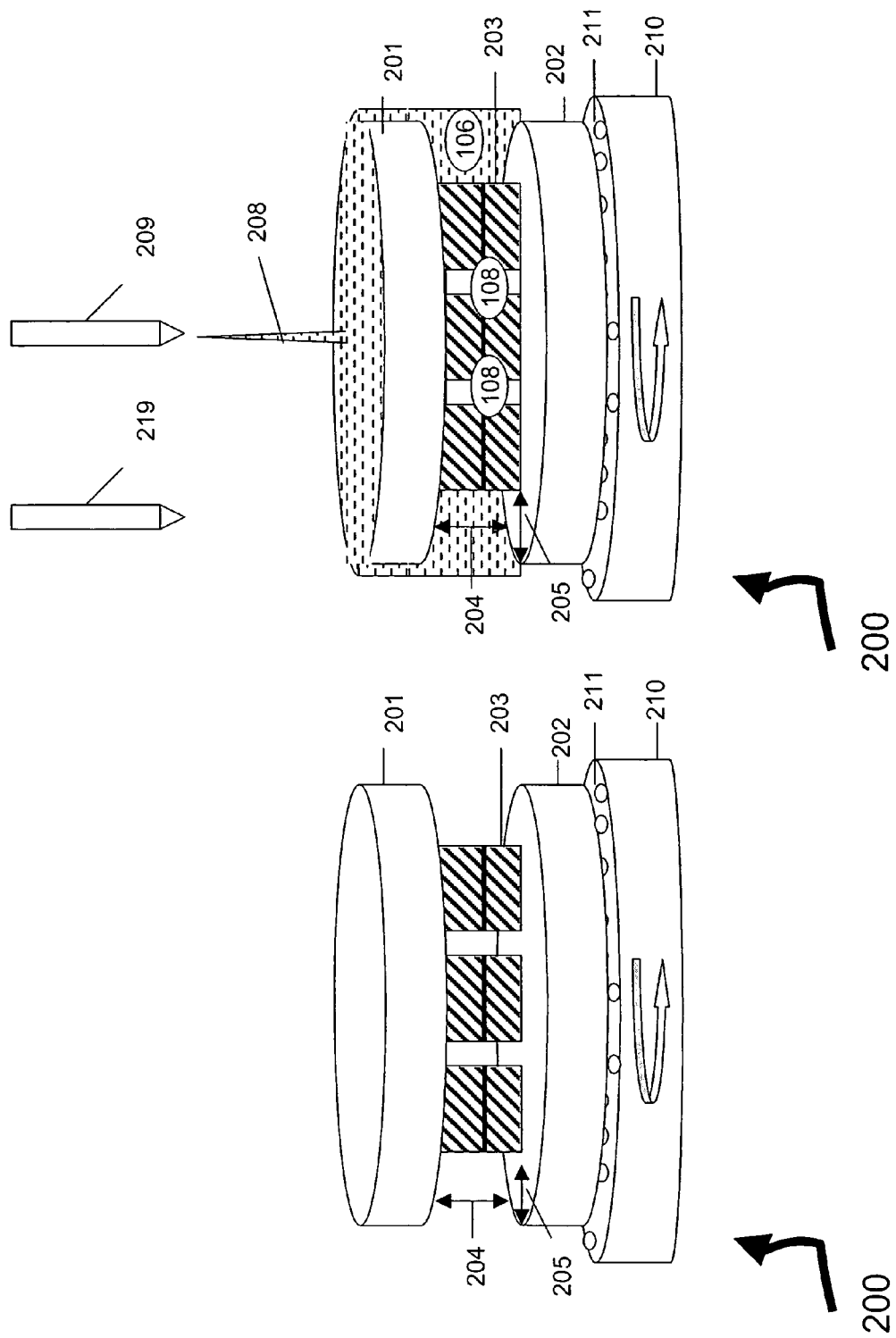
FIGS. 2A–2B illustrates a method for applying a material on top of a first wafer of a coupled wafer pair in accordance with an embodiment of the present invention.

An example of a method for applying a material on top of a first wafer 201 of a coupled wafer pair 200 in accordance with an embodiment of the present invention is illustrated in FIGS. 2A–2B. In one embodiment of the present invention, the coupled wafer pair is formed similarly as described with reference to FIGS. 1A–1D. In one embodiment of the present invention, there are more than two wafers that are coupled together. The coupled wafer pair 200 is placed over a chuck 210 having a plurality of vacuum ports 211. In one embodiment of the present invention, the vacuum ports 211 generate a vacuum to secure the coupled wafer pair 200 to the chuck 210.

Next, the chuck 210 and the coupled wafer pair 200 are spun around at a first spin speed. In one embodiment of the present invention, the first spin speed is approximately 500–3,000 rotations per minute. In one embodiment of the present invention, the first spin speed is performed at a rate of at least 1000 rpm for approximately 20 seconds if the first wafer 201 and a second wafer 202 are 300 mm in diameter.

Next, as shown in FIG. 2B, an applicator 209 applies a material 208 on top of the coupled wafer 200. In one embodiment of the present invention, the material 208 is applied at the center over the top of the wafer 201. In another embodiment of the present invention, the material 208 is applied anywhere on top of the wafer 201. In one embodiment the applicator 209 is a syringe. In another embodiment of the present invention, the applicator 209 is a dispenser nozzle. In one embodiment of the present invention, an applicator 219, instead of the applicator 209, applies the material 208 on the top edge of the coupled wafer 200. In one embodiment of the present invention, the material 208 covers the bevel of the coupled wafer pair 200. In one embodiment of the present invention, the material 208 covers the edge bead removal region of the coupled wafer pair. In one embodiment of the present invention, the material 208 covers a depth necessary to prevent the coupled wafer pair 200 from cracking when it is later grinded. In one embodiment of the present invention, the material 208 covers a depth necessary to prevent an interconnect layer 203 from corroding.

In one embodiment of the present invention, a low viscosity polymer is preferred for the material 208 when a height 204 between the coupled wafers 201 and 202 is less than 1 micron in height. In this instance, a low viscosity polymer is preferred in order to maximize the ability of the material 208 to fill the outer gap 106, formed by the product of the height 204 and a depth 205. In one embodiment of the present invention, the gap between the coupled wafers 201 and 202 is at least 250 microns in depth and at most 300 microns in the height 204. In one embodiment of the present invention, a high viscosity polymer material is preferred for the material 208. A high viscosity polymer is preferred when the height 204 between the coupled wafers 201 and 202 is greater than 5 microns. In this instance, a high viscosity polymer is preferred in order to prevent the material 208 from spinning away and off of the coupled wafer pair 200. In one embodiment of the present invention, when the height 204 between the coupled wafers 201 and 202 is between 1 micron and 5 microns, a low viscosity polymer or a high viscosity polymer can be used.

In one embodiment of the present invention, the high viscosity and low viscosity polymer material is selected from a group consisting of SiLK-J, polyimide, spin-on glass, benzocyclobutene, polynorbornene, and polyarylenes. In one embodiment of the present invention, the material 208 has a viscosity of less than 1,000 centipoise when the height 204 is less than 1 micron. In another embodiment when the height 204 is greater than 5 microns, the material 208 has a viscosity of greater than 1,000 centipoise. In one embodiment of the present invention, the coupled wafer pair 200 are coupled wafers that are coupled through the interconnect layer 203.

Next, the coupled wafer 200 is spun at a second spin speed after the applicator 209 finishes dispensing the material 208. In one embodiment of the present invention, this second spin speed is approximately 0–50 rotations per minute. Because the second spin speed is so much less than the first spin speed, the material 208 is wicked around the edge of the first wafer 201 as a result of capillary forces. The material 208 then fills the outer gap 106, formed by the product of the depth 205 and the height 204 in the coupled wafer pair 200. In one embodiment of the present invention, the second spin speed is performed at a deceleration rate of approximately 5,000–10,000 rotations per minute.

In one embodiment of the present invention, the material 208 is cured (e.g., the material 208 is cured to harden it after it is applied). For instance, the material 208 may be cured using a polymerization technique. Alternatively, the material 208 may be cured using thermal curing or UV curing. In one embodiment of the present invention, curing holds the coupled wafer pair 200 between 75–150 C for 1 hour in air or nitrogen for epoxy type materials. In another embodiment of the present invention, curing holds the coupled wafer pair 200 between 200–400 C for 1 hour in nitrogen for spin-on polymer materials. In one embodiment of the present invention, curing is performed by epoxy materials that harden without heat (e.g., cross-linking agent is added to a polymer).

In one embodiment of the present invention, the coupled wafer 200 is spun at a third spin speed to clear the excessive material 208. In one embodiment of the present invention, the third spin speed is the same as the first spin speed. In one embodiment of the present invention, the coupled wafer pair 200 is ground down to a thickness of approximately 10–50 microns after the material 208 is applied.

FIGS. 3A and 3B illustrate a method for applying the material 208 directly in the outer gap 106 between a coupled wafer pair 300, in accordance with an embodiment of the present invention. The coupled wafer 300 is placed over the chuck 210 having a plurality of the vacuum ports 211. In one embodiment of the present invention, the vacuum ports 211 generate the vacuum to bring the coupled wafer pair 300 down to the chuck 210.

Next, the chuck 210 and the coupled wafer pair 300 are spun around at a first spin speed. In one embodiment of the present invention, the first spin speed is approximately 500–3,000 rotations per minute.

Next, as shown in FIG. 3B, an applicator 309 applies the material 208 directly into the outer gap 106 in the coupled wafer pair 300. Applying the material 208 directly between the outer gap 106 prevents later cleanup of material on the top of a wafer, as required in FIG. 2. Furthermore, applying the material 208 directly between the outer gap 106 minimizes the quantity of the material 208 that must be used because material is not wasted on the top of a wafer.

In one embodiment of the present invention, the applicator 309 applies the material 208 at a 90 degree angle to the coupled wafer pair 300. In one embodiment of the present invention, the applicator 309 applies a material horizontally, directly into the outer gap 106 between the coupled wafer pair 300. In one embodiment of the present invention, the applicator 309 is brought into the center gap 108 before applying the material 208. In one embodiment of the present invention, the applicator 309 applies material at an angle less than 90 degrees to the coupled wafer pair 300. The coupled wafer pair 300 is spun on the chuck 210 while the applicator 309 applies material directly into the outer gap 106. This causes the entire outer gap 106 to be filled by the material 208. In one embodiment of the present invention, the applicator 309 is a syringe. In another embodiment of the present invention, the applicator 309 is a dispenser nozzle. In one embodiment of the present invention, the material 208 is cured after injection and prior to cutting and/or grinding.

In one embodiment of the present invention, a low viscosity polymer material is preferred for the material 208. A low viscosity polymer is preferred when the height 204 between the coupled wafers 201 and 202 is less than 1 micron in height. In this instance, a low viscosity polymer is preferred in order to maximize the ability of the material 208 to fill the outer gap 106 formed by the product of the height 204 and the depth 205. In another embodiment of the present invention, a high viscosity polymer material is preferred for the material 208. A high viscosity polymer is preferred when the height 204 between the coupled wafers 201 and 202 is greater than 5 microns. In this instance, a high viscosity polymer is preferred in order to prevent the material 208 from spinning away and off of the coupled wafer pair 300 because of its greater thickness. In one embodiment of the present invention, when the height 204 between the coupled wafers 201 and 202 is between 1 micron and 5 microns, a low viscosity polymer or a high viscosity polymer can be used. Other embodiments of the present invention as shown in FIGS. 3A and 3B are similar to those described in detail with reference to FIGS. 2A–2B.

FIGS. 4A and 4B illustrate a method for applying the material 208 through a hole 406 in a first wafer 401 of a coupled wafer pair 400, in accordance with an embodiment of the present invention. In one embodiment of the present invention, the hole 406 is created at the center of the first wafer 401 of the coupled wafer pair 400. In one embodiment of the present invention, the hole 406 is created before the first wafer 401 is coupled to the second wafer 202. In one embodiment of the present invention, the hole 406 is created using a hollow cord drill bit. For instance, a hollow cord drill bit ranging in size from approximately 1/16 to 1/4 inches to make approximately a 1/4 to 1/16 inch hole in diameter. In one embodiment of the present invention, the hole 406 is created using laser pulsing. For instance, the laser pulsing can last 5 to 15 seconds. In one embodiment of the present invention, the hole 406 is created using an ion beam.

In one embodiment of the present invention, the hole is the size of a dummified region on the coupled wafer pair 400. The dummified region does not contain any integrated circuits but only contains blank die. The hole 406 should preferably be as small as possible, in one embodiment of the present invention, in order to maximize die yield on the coupled wafer pair 400. By limiting the hole 406 to a dummified region on the first wafer 401, die yield impact is not impacted significantly. In one embodiment of the present invention, the hole 406 is approximately 1 millimeter or larger in order to maximize the amount of the material 208 that passes through the hole 406 and the coupled wafer pair 400. In one embodiment of the present invention, the hole may be created on the first wafer 401 and on the second wafer 202. In one embodiment of the present invention, multiple holes may be created on various locations of the first wafer 401. In one embodiment of the present invention, the hole 406 may be created on the second wafer 202.

Next, the coupled wafer pair 400 is placed on the chuck 210. The coupled wafer pair 400 is held on the chuck 210 through the vacuum 211 that is applied on the coupled wafer pair 400 to hold the coupled wafer pair 400 in place. Unlike FIG. 2B and FIG. 3B, the coupled wafer pair 400 and the chuck 210 are not spun in one embodiment of the present invention, as illustrated in FIG. 4B.

Next, the material 208 is applied by an applicator 409 through the hole 406 in the first wafer 401. In one embodiment of the present invention, the applicator 409 is the same applicator as the applicator 209 described with reference to FIG. 2B. By applying the material 208 directly into the center of the coupled wafer pair 400 through the hole 406, the center gap 108 between members of the interconnect layer 203 are supported. In addition, by applying the material 208 directly into the center of the coupled wafer pair 400, the interconnect layer 203 does not corrode and individual devices that are cut from the coupled wafer pair 400 are better supported. In one embodiment of the present invention, the material 208 may also flow to the outer gap 106 in addition to the center gap 108 of the coupled wafer pair 400. In one embodiment of the present invention, the applicator 409 is a syringe. In another embodiment of the present invention, the applicator 409 is a dispenser nozzle. In one embodiment of the present invention, the material 208 is cured after injection and prior to cutting and/or grinding.

In one embodiment of the present invention, when the height 204 between the coupled wafers 401 and 202 is between 1 micron and 5 microns, a low viscosity polymer or a high viscosity polymer can be used. In one embodiment of the present invention, the high viscosity and low viscosity polymer material is selected from a group consisting of SiLK-J, polyimide, spin-on glass, benzocyclobutene, polynorbornene, and polyarylenes. In one embodiment of the present invention, the material 208 has a viscosity of less than 1,000 centipoise when the height 204 is less than 1 micron. In another embodiment when the height 204 is greater than 5 microns, the material 208 has a viscosity of greater than 1,000 centipoise. In one embodiment of the present invention, the gap between the coupled wafers 401 and 202 is at least 250 microns in depth and at most 300 microns in the height 204. In one embodiment of the present invention, the coupled wafer pair 400 is ground down to a thickness of approximately 10–50 microns after the material 208 is applied. Other embodiments of the present invention as shown in FIGS. 4A and 4B are similar to those described with reference to FIGS. 2A and 2B.

FIGS. 5A and 5B illustrate a method of applying the material 208 through the hole 406 in the first wafer 401 of a coupled wafer pair 500 and spinning the coupled wafer pair 500, in accordance with an embodiment of the present invention. FIGS. 5A and 5B show the coupled wafer pair 500 that is similar to the coupled wafer pair in FIGS. 4A and 4B, except that the coupled wafer pair 500 is spun on the chuck 210. Spinning the coupled wafer pair 500 on the chuck 210 assists the material 208 to flow to the edge of the first wafer 401 in addition to passing through the hole 406 into the center gap 108 of the coupled wafer pair 500. As a result, a larger portion of the outer gap 106 is filled by the material 208. In one embodiment of the invention, the outer gap 106 is an area formed by the product of the height 204 and the depth 205. In one embodiment of the invention, the material 208 is a low viscosity polymer or a high viscosity polymer depending on the height 204 as described with reference to FIGS. 2A–2B. In one embodiment of the present invention, the material 208 is cured after injection and prior to cutting and/or grinding. Other embodiments of the present invention as shown in FIGS. 5A and 5B are similar to those described with reference to FIGS. 4A and 4B.

Figure 6:
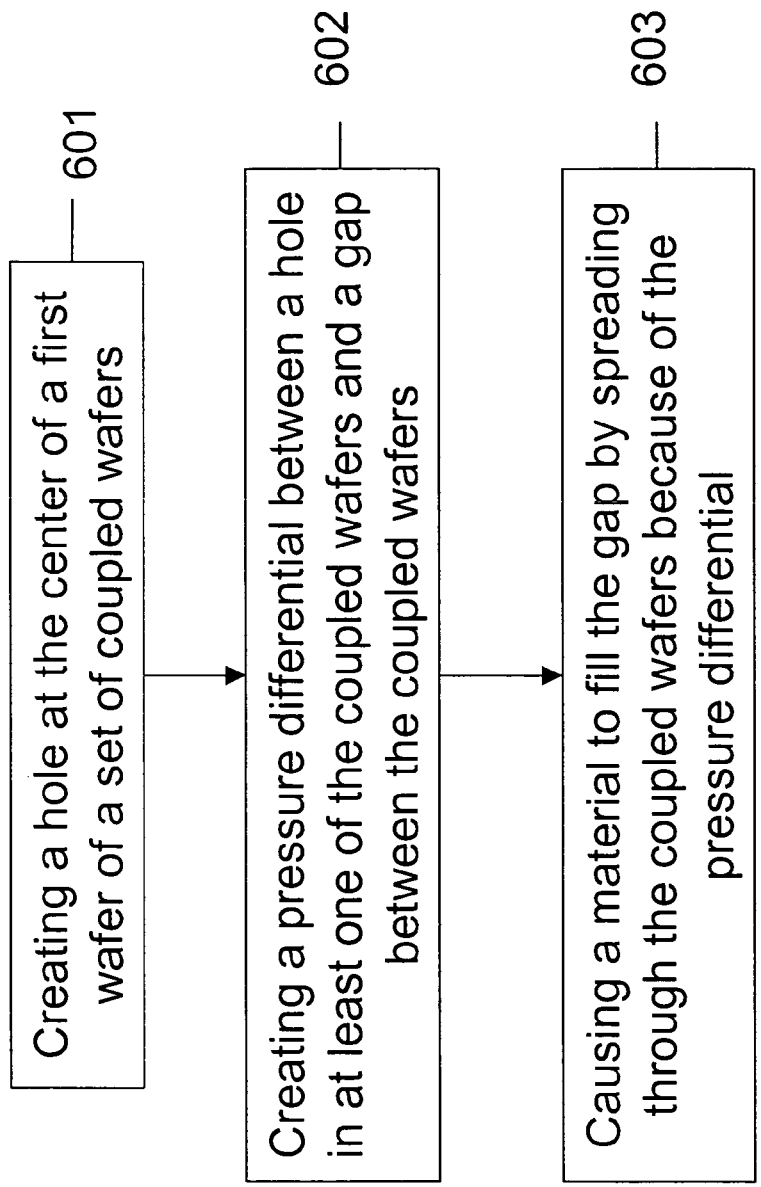
FIG. 6 illustrates a process flow for creating a pressure differential to assist a material in filling a gap between a coupled wafer pair having at least one hole.

FIG. 6 illustrates a process flow for creating a pressure differential to assist a material in filling a gap between a coupled wafer pair having at least one hole. In 601, the hole 406 is created at the center of the first wafer 401, as described with reference to FIGS. 4A–4B. In one embodiment of the present invention, the hole 406 can be anywhere on top of the first wafer 401. In one embodiment of the present invention, the hole 406 can be on the second wafer 202. In one embodiment of the present invention, the hole 406 can be anywhere on the first wafer 401 and/or the second wafer 202. In one embodiment of the present invention, the hole 406 is created at the center of the first wafer 401 of coupled wafer pair. In one embodiment of the present invention, the hole 406 is created before the first wafer 401 is coupled to the second wafer 202. In one embodiment of the present invention, the hole 406 is created using a hollow cord drill bit. For instance, a hollow cord drill bit ranging in size from approximately 1/16 to 1/4 inches to make approximately a 1/4 to 1/16 inch hole in diameter. In one embodiment of the invention, embodiments of the hole 406 are the same as that described with reference to FIGS. 4A–4B.

Next, in 602, a pressure differential is created between the hole 406 in at least one of the coupled wafers and the center gap 108 and the outer gap 106 between the coupled wafer pair. In one embodiment of the present invention, a vacuum creates a pressure differential between the hole 406 and the outer gap 106. In one embodiment of the present invention, a vacuum is applied directly into the hole 406 and the material 208 is applied at the gap. In one embodiment of the present invention, a vacuum is applied directly into a gap between the coupled wafer pair 400 and the material 208 is applied at the hole 406. This embodiment switches the place of the vacuum and the applicator and may provide preferred characteristics for the diffusion of the material 208 in some embodiments of the present invention. In one embodiment of the present invention, a positive pressure is applied at the outer gap 106 in addition to an applicator 509 to increase the diffusion of the material 208 toward the center gap 108 of coupled wafer pair.

In 603, the material 208 fills the outer gap 106 and the center gap 108 by spreading through the coupled wafers because of the pressure differential. In one embodiment of the present invention, the material 208 is applied similarly as described with reference to FIGS. 3A–3B. In one embodiment of the present invention, the material 208 is drawn toward the hole 406 through the application of a vacuum as described with reference to 602. In one embodiment of the present invention, a high viscosity or a low viscosity polymer is used for the material 208 depending on the height 204, as described with reference to FIGS. 3A–3B. In one embodiment of the invention, a pressure differential is created by a vacuum applied at the hole 406 and a positive pressure applied at the outer gap 106. In one embodiment of the present invention, the material 208 is cured after injection and prior to cutting and/or grinding.

Figure 7:
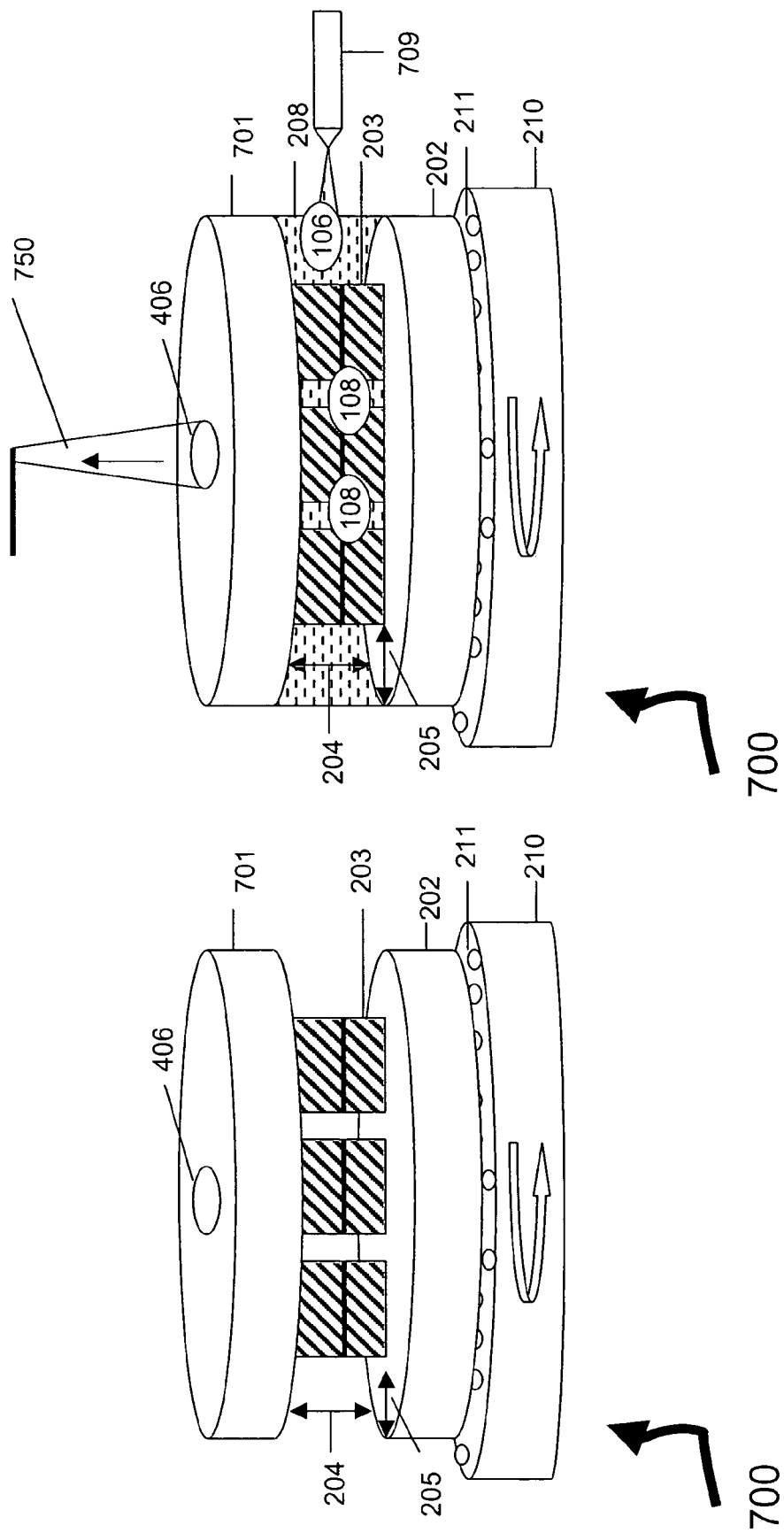
FIGS. 7A–7B illustrates a method for applying a material directly in a gap between a coupled wafer pair and applying a vacuum through a hole in a first wafer of the coupled wafer pair in accordance with an embodiment of the present invention.

FIGS. 7A and 7B illustrate a method for applying the material 208 directly in the outer gap 106 between a coupled wafer pair 700 and applying a vacuum 750 through the hole 406 in a first wafer 701 of the coupled wafer pair 700, in accordance with an embodiment of the present invention. In FIG. 7B, the vacuum 750 is applied to the hole 406 of the coupled wafer pair 700. This vacuum 750 creates a pressure differential between the center gap 108 of the coupled wafer pair 700 and the edge of the coupled wafer pair where an applicator 709 is applied. The applicator 709 applies the material 208 directly in between a gap of the coupled wafer pair 700. The chuck 210 spins the coupled wafer pair 700 prior to applying the material 208 as described with reference to FIGS. 2A–2B.

In addition, various embodiments of the present invention can be used to create the hole 406 as described with reference to FIGS. 4A–4B. In addition, the vacuum 750 is applied during the application of the material 208. As such, the material 208 moves from the outer gap 106 toward the center gap 108 of the coupled wafer pair 700 because of the pressure differential created by the vacuum 750. In one embodiment of the present invention, the vacuum 750 is applied directly into a gap between the coupled wafer pair 700 and the material 208 is applied at the hole 406. This embodiment switches the place of the vacuum 750 and the applicator 709 and may provide preferred characteristics for the diffusion of the material 208 in some embodiments of the present invention. In one embodiment of the present invention, a positive pressure is applied at the outer gap 106 in addition to the applicator 709 to increase the diffusion of the material 208 toward the center gap 108 of the coupled wafer pair 700. In one embodiment of the present invention, the material 208 is cured after injection and prior to cutting and/or grinding. Other embodiments of the present invention as shown in FIGS. 7A and 7B are similar to those described with reference to FIGS. 2A–2B, FIGS. 4A–4B, and FIGS. 5A–5B.

Figure 8:
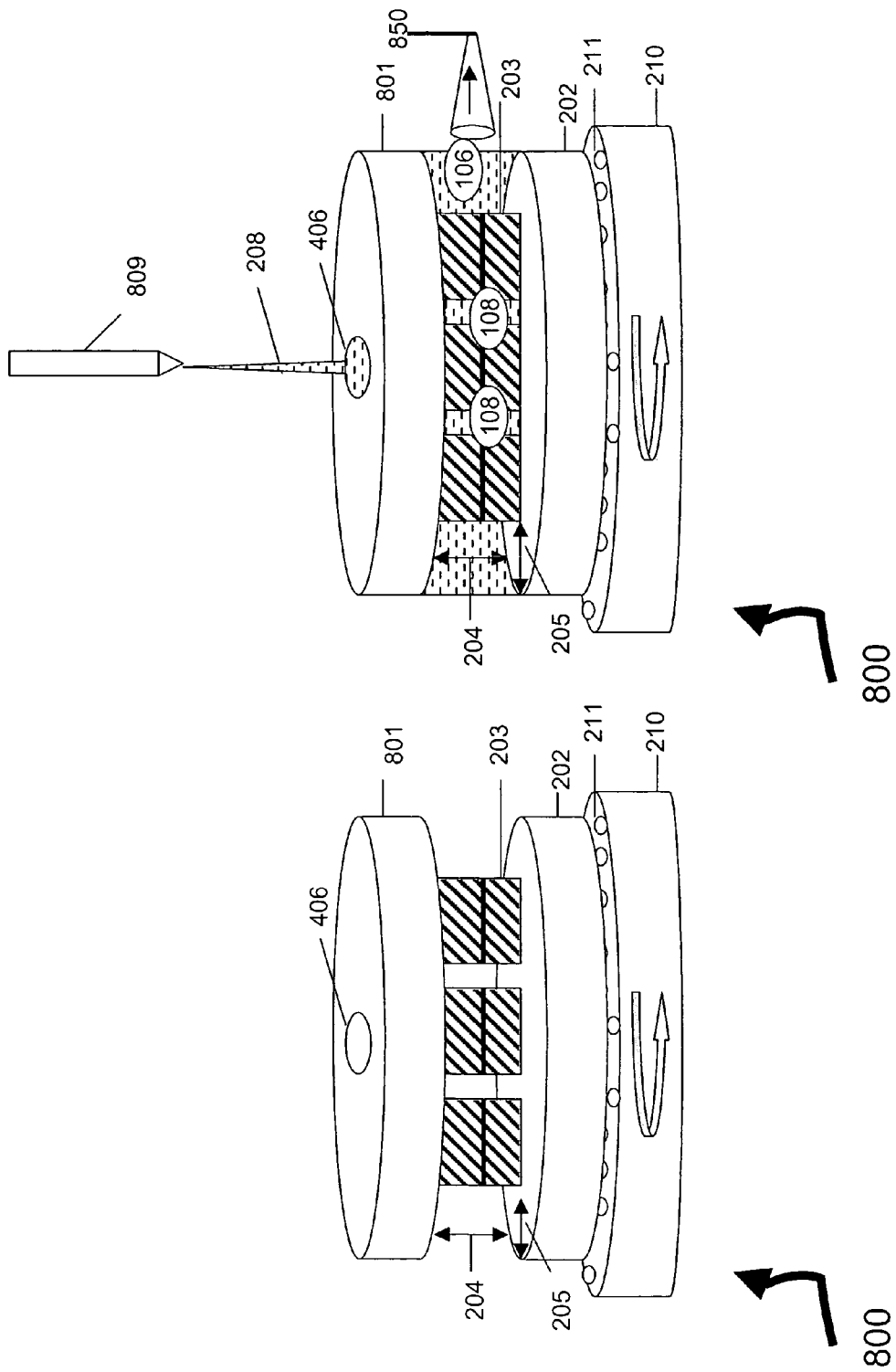
FIGS. 8A–8B illustrates a method for applying a material through a hole in a first wafer of a coupled wafer pair, spinning the coupled wafer pair, and applying a vacuum directly in a gap between the coupled wafer pair in accordance with an embodiment of the present invention.

FIGS. 8A–8B illustrates a method of applying the material 208 through the hole 406 in a first wafer 801 of a coupled wafer pair 800, spinning the coupled wafer pair 800 and applying a vacuum 850 directly in the outer gap 106 between the coupled wafer pair 800, in accordance with an embodiment of the present invention. FIG. 8B includes the coupled wafer 800, which is similar to the coupled wafer 700 as described with reference to FIGS. 7A–7B. However, an applicator 809 is applied through the hole 406 on the coupled wafer 800, and the vacuum 850 is applied directly in between the outer gap 106 of the coupled wafer pair 800. As a result, the material 208 is pulled toward the outer gap 106 by a pressure differential between the hole 406 and the outer gap 106 of the coupled wafer 800. In one embodiment of the present invention, the material 208 is cured after injection and prior to cutting and/or grinding. Other embodiments of the present invention as shown in FIGS. 8A and 8B are similar to those described with reference to FIGS. 2A–2B, FIGS. 4A–4B, FIGS. 5A–5B, and FIGS. 7A–7B.

FIGS. 9A–9B illustrates a method for applying the material 208 and a positive pressure 950 through the hole 406 in a first wafer 901 of a coupled wafer pair 900, spinning the coupled wafer pair 900 and applying a vacuum 960 directly in the outer gap 106 between the coupled wafer pair 900, in accordance with an embodiment of the present invention. The coupled wafer 900 is similar to the coupled wafer 800, as described with reference to FIGS. 8A–8B. The only difference between the coupled wafer 900 and the coupled wafer pair 800 is that the positive pressure 950 is applied in addition to the material 208 through the hole 406 in the coupled wafer pair 900. This positive pressure 950 is applied in addition to the vacuum 960 that is applied directly in between the outer gap 106 of the coupled wafer pair 900. By having the positive pressure 950 in addition to the vacuum 960 at the edge, a larger pressure differential is created and the material 208 is better able to reach the outer gap 106 of the coupled wafer pair 900. In one embodiment of the present invention, an applicator 909 is designed specifically for use with the positive pressure 950. In one embodiment of the present invention, the material 208 is cured after injection and prior to cutting and/or grinding.

Figure 9:
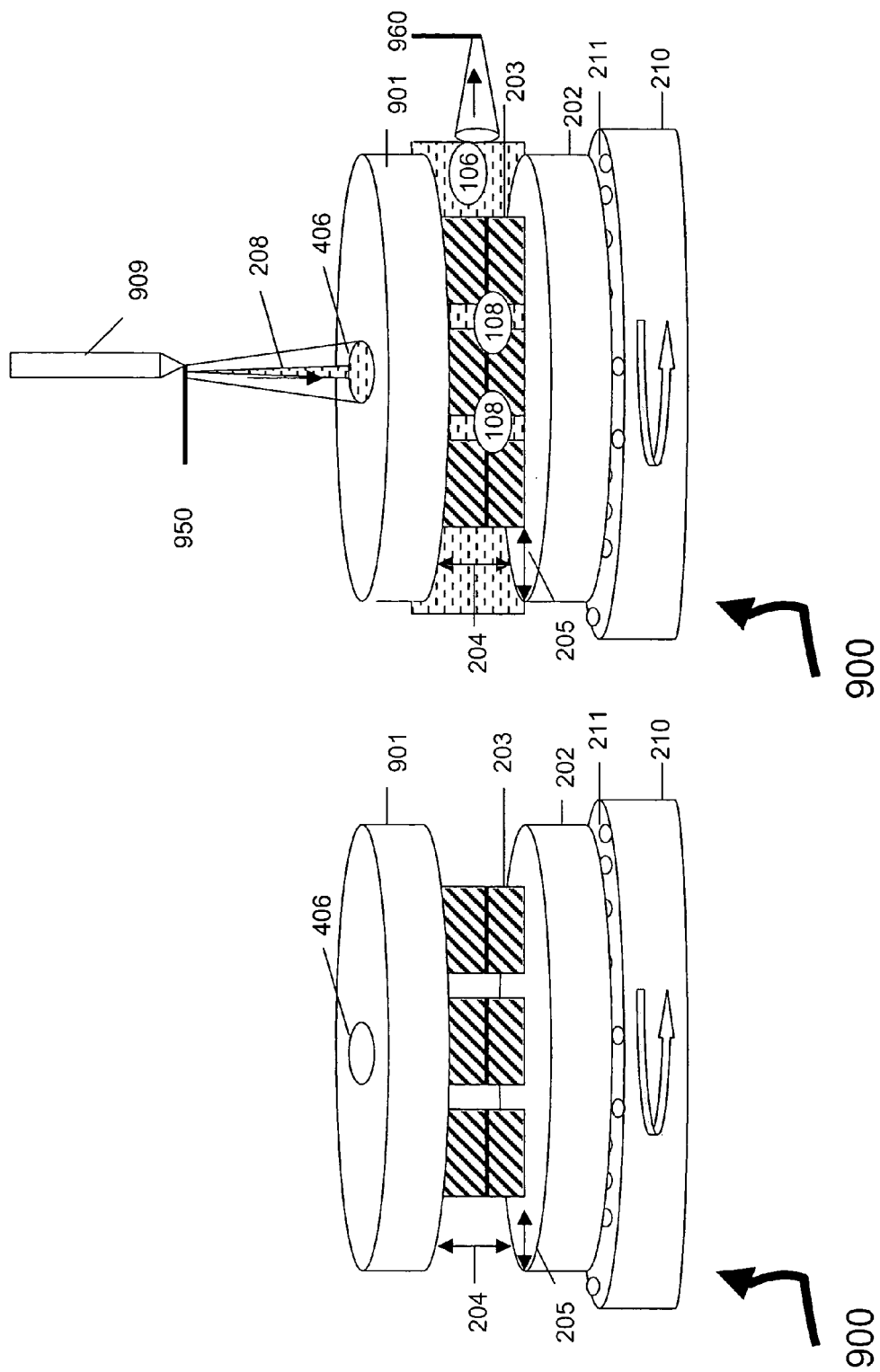
FIGS. 9A–9B illustrates a method for applying a material and a positive pressure through a hole in a first wafer of a coupled wafer pair, spinning the coupled wafer pair, and applying a vacuum directly in a gap between the coupled wafer pair in accordance with an embodiment of the present invention.
Figure 10:
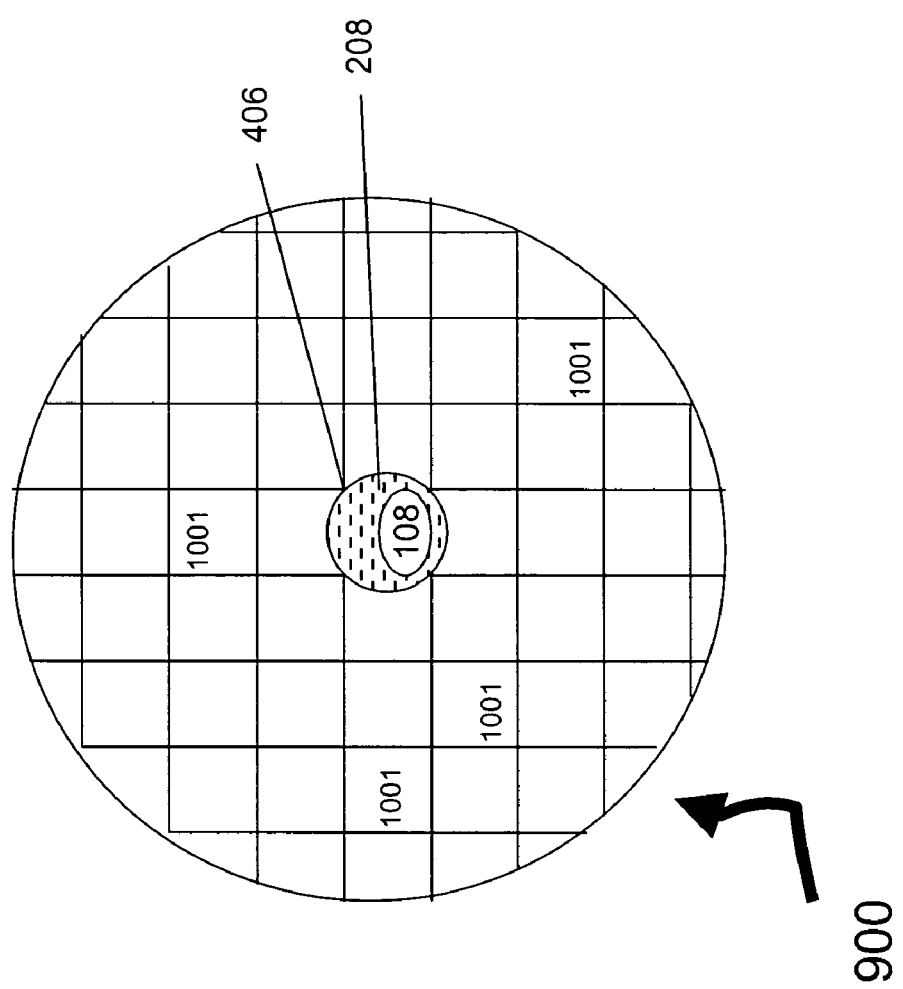
FIG. 10 illustrates a top view of a coupled wafer pair having a plurality of dice and a gap fill in accordance with an embodiment of the present invention.

FIG. 10 illustrates a top view of the coupled wafer pair 900 having a plurality of dice 1001 and a gap fill, in accordance with an embodiment of the present invention. In one embodiment of the present invention, top view as shown in FIG. 10 is the first wafer 901 of the coupled wafer pair 900. In one embodiment of the present invention, coupled wafer pair contains a plurality of the dice 1001 having integrated circuits that are sliced and diced from the coupled wafer pair 900 into single stack chip die. FIG. 10 also illustrates the hole 406 in the coupled wafer pair 900 that fills the center gap 108 with the material 208. In on embodiment of the invention, the material 208 also fills the outer gap 106 between the coupled wafer pair 900 as shown in FIG. 9B. In one embodiment of the present invention, the material 208 is applied into a gap between the coupled wafer pair 900 as described with reference to FIGS. 2A–9B. In one embodiment of the present invention, the material 208 is cured after injection and prior to cutting and/or grinding.

Figure 11:
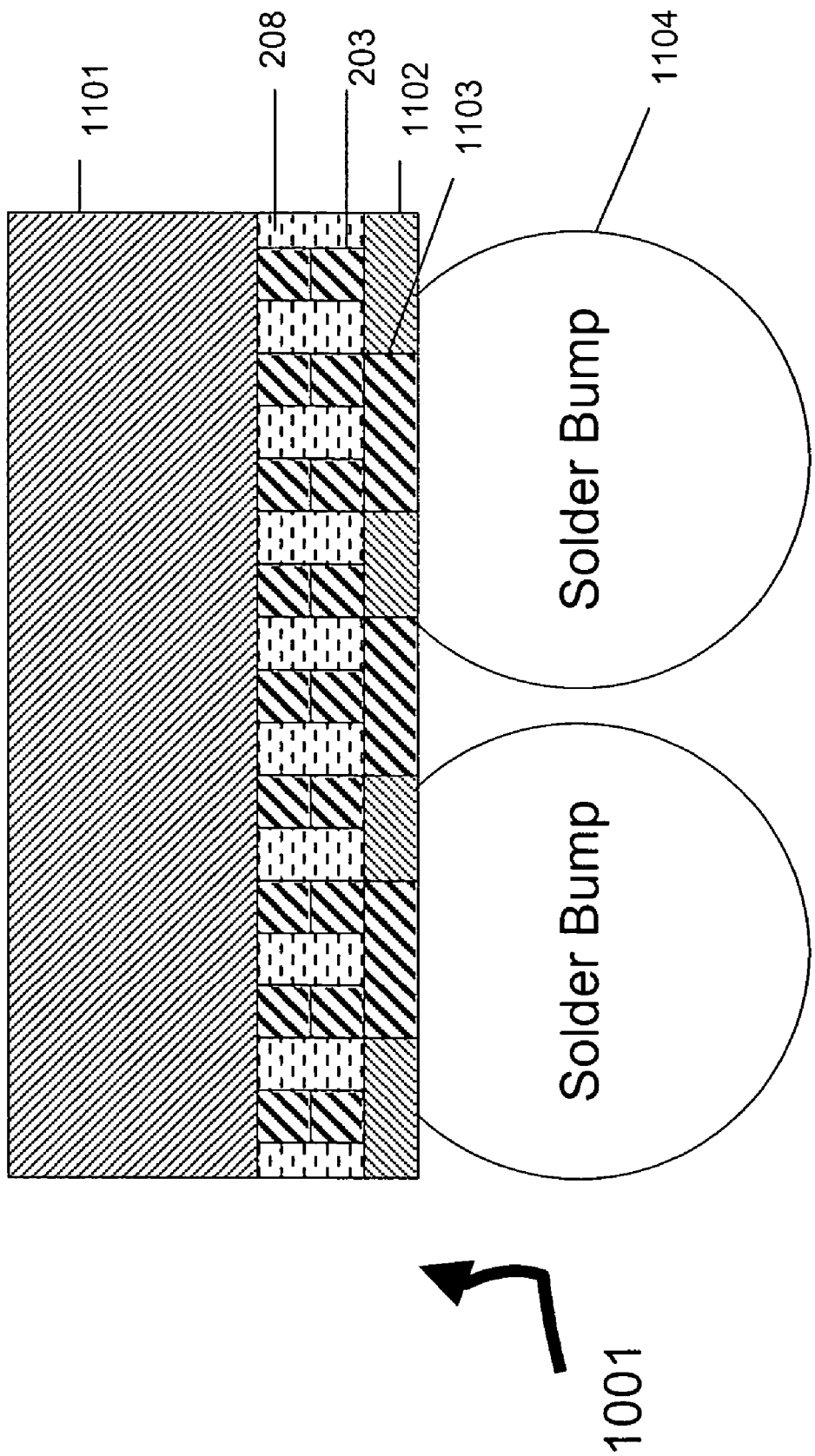
FIG. 11 illustrates a die that is cut from a coupled wafer pair having a gap fill in accordance with an embodiment of the present invention.

FIG. 11 illustrates a die 1001 that is cut from the coupled waferpair 900 having a gap fill, in accordance with an embodiment of the present invention. In FIG. 11, the die 1001 is one of a plurality of dice as illustrated with FIG. 10. In one embodiment of the present invention, the die 1001 is a single stack chip die. In FIG. 11, a substrate 1101 is connected to a substrate 1102 through in the interconnect layer 203. The material 208 fills the region having gaps in between the substrates 1101 and 1102. In one embodiment of the present invention, a copper vias 1103 in the substrate 1102 connect the die 1001 to a solder bumps 1104. In one embodiment of the present invention, the solder bumps 1104 connect the die 1001 to a packaging layer of an integrated circuit. In one embodiment of the present invention, the die 1001 is a three-dimensional integrated circuit device having a first integrated circuit and a second integrated circuit. In one embodiment of the present invention, the die 1001 is a three-dimensional integrated circuit device having a first integrated circuit and a second integrated circuit that are parts of a single microprocessor. In one embodiment of the present invention, the die 1001 is a stacked chipset. In one embodiment of the present invention, a material 203 is polymer foam. In one embodiment of the present invention, the material 208 is cured after injection and prior to cutting and/or grinding. In one embodiment of the present invention, the material 203 is similar to the material as described with reference to FIGS. 2A–2B.

It should be noted that the embodiments disclosed herein may be applied to the formation of any stacked microelectronic device. Certain features of the embodiments of the claimed subject matter have been illustrated as described herein, however, may modifications, substitutions, changes and equivalents will be evident to those skilled in the art. Additionally, while several functional blocks and relationships have been described in detail, it is contemplated by those of skill in the art that several of the operations may be performed without the use of the others, or additional functions or relationships between operations may be established and still remain in accordance with the claimed subject matter. It is, therefore, to be understood that the appended claims are intended to cover all such modifications and changes as fall within the true spirit of the claimed subject matter.

We claim:

1. A process, comprising:
    spinning a first wafer bonded to a second wafer at a first spin speed, said first wafer positioned above said second wafer to form a gap between said bonded first and second wafers; and
    applying a material on a top surface of said first wafer until said material flows to an edge of said first wafer enabling said material to flow into said gap between said bonded first and second wafers.

2. The process of claim 1, further comprising:
    spinning said first wafer bonded to said second wafer at a second spin speed to a point where said material flows from said edge of said first wafer to fill said gap between said first wafer and second wafer; and
    curing said material.

3. The process of claim 2, further comprising:
    spinning said first wafer bonded to said second wafer at a third spin speed to clear excessive said material.

4. The process of claim 3, further comprising:
    grinding down said first wafer to a thickness of approximately 10–50 microns.

5. The process of claim 1, wherein said gap is less than 1 micron in height, and said material is a low viscosity polymer material from a group consisting of SiLK-J, polyimide, spin-on glass, benzocyclobutene, polynorbornene, and polyarylenes.

6. The process of claim 1, wherein said gap is greater than 5 microns in height, and said material is a high viscosity polymer material from a group consisting of SiLK-J, polyimide, spin-on glass, benzocyclobutene, polynorbornene, and polyarylenes.

7. The process of claim 5, wherein said material has a viscosity of less than 1000 centipoise.

8. The process of claim 6, wherein said material has a viscosity of greater than 1000 centipoise.

9. The process of claim 1, wherein said gap is at least 250 microns in depth and at most 300 microns in height.

10. The process of claim 2, wherein said second spin speed is performed at a deceleration rate of approximately 5,000 to 10,000 rpm/second.

11. The process of claim 1, wherein said applying a material is at a center of the top of said first wafer.

12. The process of claim 3, wherein said third spin speed is faster than said second spin speed.

13. The process of claim 3, wherein said first spin speed is approximately 500 to 3,000 rpm.

14. The process of claim 13, wherein said first spin speed and said third spin speed are the same.

15. The process of claim 13, wherein said second speed is approximately 0 to 50 rpm.

16. The process of claim 13, wherein said material is applied directly into said gap between said first wafer and said second wafer.

17. A process, comprising:
    creating a hole in a center of a first wafer;
    bonding said first wafer to a second wafer to create a bonded wafer pair;
    applying a polymer material through said hole to cause said material to flow through said hole and into a gap between said bonded wafer pair; and
    curing said material.

18. The process of claim 17, further comprising:
    spinning said bonded wafer pair while applying said material.

19. The process of claim 18, further comprising:
    reducing spin speed of spinning suddenly to fill a gap between said bonded wafers after applying said material.

20. The process of claim 19, further comprising:
    increasing spin speed of spinning said bonded wafer pair to clear excessive said material.

21. The process of claim 17, in which said material also flows to the edge of said first wafer.

22. The process of claim 17, in which creating said hole is created using approximately a ¼ to 1/16 inch hollow core drill bit having a diamond coating on it to make an approximately ¼ to 1/16 inch hole in diameter.

23. The process of claim 22, in which creating said hole is performed before said bonding.

24. The process of claim 17, in which creating said hole is created using approximately 5 to 15 second laser pulsing.

25. The process of claim 17, in which creating said hole is created using an ion beam.

26. The process of claim 17, in which said hole is a size of a dummified region on said bonded wafer pair.

27. The process of claim 17, in which said hole is approximately 1 millimeter or larger.

28. The process of claim 17, in which a plurality of holes is created in said first wafer.

29. A wafer coupling method, comprising:
spinning a set of coupled wafers;
creating a pressure differential between a hole in at least one of the coupled wafers and a gap between the coupled wafers;
causing a material to fill said gap by spreading said material through said coupled wafers because of said pressure differential; and
curing said material.

30. The method of claim 29, in which a vacuum creates said pressure differential between said hole and said gap.

31. The method of claim 30, in which said vacuum is applied directly at said hole, and said material is applied directly at said gap.

32. The method of claim 30, in which said vacuum is applied directly at said gap, and said material is applied directly at said hole.

33. The method of claim 32, further comprising:
applying a positive pressure at said hole to push said material through said hole.

34. The method of claim 29, further comprising:
grinding down at least one of said coupled wafers to a thickness of approximately 10–50 microns.

35. The method of claim 29, wherein said gap is less than 1 micron in height, and said material is a low viscosity polymer material from a group consisting of SiLK-J, polyimide, spin-on glass, benzocyclobutene, polynorbornene, and polyarylenes.

36. The method of claim 29, wherein said gap is greater than 5 microns in height, and said material is a high viscosity polymer material from a group consisting of SiLK-J, polyimide, spin-on glass, benzocyclobutene, polynorbornene, and polyarylenes.

37. The method of claim 35, wherein said material has a viscosity of less than 1000 centipoise.

38. The method of claim 36, wherein said material has a viscosity of greater than 1000 centipoise.

39. A wafer coupling method, comprising:
creating a hole in a center of a first wafer;
coupling said first wafer to a second wafer to create a coupled wafer pair;
spinning said coupled wafer pair;
applying a vacuum at said hole;
applying a material directly into a gap between said coupled wafer pair;
attracting said material toward said hole of said coupled wafer pair through said gap by applying said vacuum at said hole; and
curing said material.

40. The method of claim 39, in which said vacuum creates a pressure differential between said hole and said gap.

41. The method of claim 39, further comprising:
grinding down said first wafer to a thickness of approximately 10–50 microns.

42. The method of claim 39, wherein said gap is less than 1 micron in height, and said material is a low viscosity polymer material from a group consisting of SiLK-J, polyimide, spin-on glass, benzocyclobutene, polynorbornene, and polyarylenes.

43. The method of claim 39, wherein said gap is greater than 5 microns in height, and said material is a high viscosity polymer material from a group consisting of SiLK-J, polyimide, spin-on glass, benzocyclobutene, polynorbornene, and polyarylenes.

44. The method of claim 42, wherein said material has a viscosity of less than 1000 centipoise.

45. The method of claim 43, wherein said material has a viscosity of greater than 1000 centipoise.

46. The method of claim 39, in which a plurality of holes is created in said first wafer.

47. The method of claim 39, in which said hole is created prior to coupling said first wafer to said second wafer.

48. A wafer coupling method, comprising:
coupling a first wafer to a second wafer to create a coupled wafer pair;
spinning said coupled wafer pair;
applying a vacuum directly in a gap between said coupled wafer pair;
applying a material on top of said coupled wafer pair causing said material to flow through a hole through said first wafer of said coupled wafer pair;
attracting said material toward said gap by creating a pressure differential between said hole and said gap; and
curing said material.

49. The method of claim 48, further comprising:
creating said hole through said first wafer in a center of said first wafer prior to coupling said first wafer to said second wafer.

50. The method of claim 48, further comprising:
grinding down said first wafer to a thickness of approximately 10–50 microns.

51. The method of claim 48, wherein said gap is less than 1 micron in height, and said material is a low viscosity polymer material from a group consisting of SiLK-J, polyimide, spin-on glass, benzocyclobutene, polynorbornene, and polyarylenes.

52. The method of claim 48, wherein said gap is greater than 5 microns in height, and said material is a high viscosity polymer material from a group consisting of SiLK-J, polyimide, spin-on glass, benzocyclobutene, polynorbornene, and polyarylenes.

53. The method of claim 51, wherein said material has a viscosity of less than 1000 centipoise.

54. The method of claim 52, wherein said material has a viscosity of greater than 1000 centipoise.

55. The method of claim 48, in which a plurality of holes is created in said first wafer.

56. The method of claim 48, further comprising:
applying a positive pressure at said hole to push said material through said hole.

57. A three-dimensional (3-D) integrated chip system, comprising:
a first wafer having a hole in a center of said first wafer;
a second wafer that is bonded to said first wafer, creating a bonded wafer pair; and
a material within a gap created when said bonded wafer pair is created, said gap between said first wafer and said second wafer in said bonded wafer pair.

58. The system of claim 57, wherein
said first wafer is grounded down to a thickness of approximately 10–50 microns after curing said material.

59. The system of claim 57, wherein said gap is less than 1 micron in height, and said material is a low viscosity polymer material from a group consisting of SiLK-J, polyimide, spin-on glass, benzocyclobutene, polynorbornene, and polyarylenes.

60. The system of claim 57, wherein said gap is greater than 5 microns in height, and said material is a high viscosity polymer material from a group consisting of SiLK-J, polyimide, spin-on glass, benzocyclobutene, polynorbornene, and polyarylenes.

61. The system of claim 59, wherein said material has a viscosity of less than 1000 centipoise.

62. The system of claim 60, wherein said material has a viscosity of greater than 1000 centipoise.

63. The system of claim 57, wherein at least two holes is created in said first wafer.

* * * * *